United States Patent
Huo

(10) Patent No.: US 11,195,846 B2
(45) Date of Patent: Dec. 7, 2021

(54) STAIRCASE STRUCTURES FOR THREE-DIMENSIONAL MEMORY DEVICE DOUBLE-SIDED ROUTING

(71) Applicant: YANGTZE MEMORY TECHNOLOGIES CO., LTD., Wuhan (CN)

(72) Inventor: Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 90 days.

(21) Appl. No.: 16/139,000

(22) Filed: Sep. 22, 2018

(65) Prior Publication Data

US 2020/0006378 A1 Jan. 2, 2020

Related U.S. Application Data

(63) Continuation of application No. PCT/CN2018/093341, filed on Jun. 28, 2018.

(51) Int. Cl.
*H01L 27/11582* (2017.01)
*H01L 23/522* (2006.01)
(Continued)

(52) U.S. Cl.
CPC ...... *H01L 27/11582* (2013.01); *H01L 23/528* (2013.01); *H01L 23/5226* (2013.01); *H01L 27/1157* (2013.01); *H01L 27/11565* (2013.01)

(58) Field of Classification Search
None
See application file for complete search history.

(56) References Cited

U.S. PATENT DOCUMENTS 9,543,318 B1    1/2017  Lu et al.
10,049,744 B2 * 8/2018  Jeong ............... H01L 21/76877
(Continued)

FOREIGN PATENT DOCUMENTS

CN    1338115 A    2/2002
CN  103871994 A    6/2014
(Continued)

OTHER PUBLICATIONS

International Search Report issued in corresponding International Application No. PCT/CN2018/093341, dated Mar. 18, 2019, 4 pages.

(Continued)

*Primary Examiner* — Abul Kalam
(74) *Attorney, Agent, or Firm* — Bayes PLLC

(57) ABSTRACT

Embodiments of staircase structures for three-dimensional (3D) memory devices double-sided routing are disclosed. In an example, a 3D memory device includes a substrate, a memory stack disposed above the substrate and including conductor/dielectric layer pairs stacked alternatingly, and an array of memory strings each extending vertically through an inner region of the memory stack. An outer region of the memory stack includes a first staircase structure disposed on the substrate and a second staircase structure disposed on the substrate. First edges of the conductor/dielectric layer pairs in the first staircase structure along a vertical direction away from the substrate are staggered laterally toward the array of memory strings. Second edges of the conductor/dielectric layer pairs in the second staircase structure along the vertical direction away from the substrate are staggered laterally away from the array of memory strings.

20 Claims, 11 Drawing Sheets

(51) Int. Cl.
  *H01L 23/528* (2006.01)
  *H01L 27/11565* (2017.01)
  *H01L 27/1157* (2017.01)

(56) References Cited

U.S. PATENT DOCUMENTS

| | | | |
|---|---|---|---|
| 10,170,570 B1* | 1/2019 | Sonehara | H01L 27/2454 |
| 10,304,852 B1* | 5/2019 | Cui | H01L 23/528 |
| 10,347,654 B1* | 7/2019 | Iwai | H01L 27/11556 |
| 10,453,860 B1* | 10/2019 | Xiao | H01L 27/11575 |
| 10,482,964 B2* | 11/2019 | Jeong | H01L 27/11556 |
| 10,483,280 B1* | 11/2019 | Xiao | H01L 27/11565 |
| 2002/0110966 A1 | 8/2002 | Lee | |
| 2012/0119287 A1* | 5/2012 | Park | H01L 27/11519 257/329 |
| 2013/0161821 A1* | 6/2013 | Hwang | H01L 27/11551 257/773 |
| 2014/0054787 A1* | 2/2014 | Eun | H01L 23/498 257/773 |
| 2015/0069616 A1 | 3/2015 | Oh et al. | |
| 2015/0179660 A1 | 6/2015 | Yada et al. | |
| 2015/0325587 A1 | 11/2015 | Chen | |
| 2016/0181323 A1 | 6/2016 | Simsek-Ege et al. | |
| 2016/0307917 A1 | 10/2016 | Yada et al. | |
| 2017/0179026 A1 | 6/2017 | Toyama et al. | |
| 2017/0200676 A1* | 7/2017 | Jeong | H01L 27/11556 |
| 2017/0207220 A1 | 7/2017 | Yun et al. | |
| 2017/0207221 A1 | 7/2017 | Kim et al. | |
| 2019/0139974 A1* | 5/2019 | Sugawara | H01L 27/11556 |

FOREIGN PATENT DOCUMENTS

| | | |
|---|---|---|
| CN | 105981171 A | 9/2016 |
| CN | 106158861 A | 11/2016 |
| CN | 106531742 A | 3/2017 |
| CN | 106920796 A | 7/2017 |
| CN | 107579070 A | 1/2018 |
| CN | 107919361 A | 4/2018 |
| CN | 108155192 A | 6/2018 |
| WO | 20150200021 A1 | 12/2015 |
| WO | 2017034647 A1 | 3/2017 |

OTHER PUBLICATIONS

Written Opinion of the International Searching Authority issued in corresponding International Application No. PCT/CN2018/093341, dated Mar. 18, 2019, 4 pages.

International Search Report issued in corresponding International Application No. PCT/CN2018/093397, dated Mar. 21, 2019, 5 pages.

Written Opinion of the International Searching Authority issued in corresponding International Application No. PCT/CN2018/093397, dated Mar. 21, 2019, 5 pages.

* cited by examiner

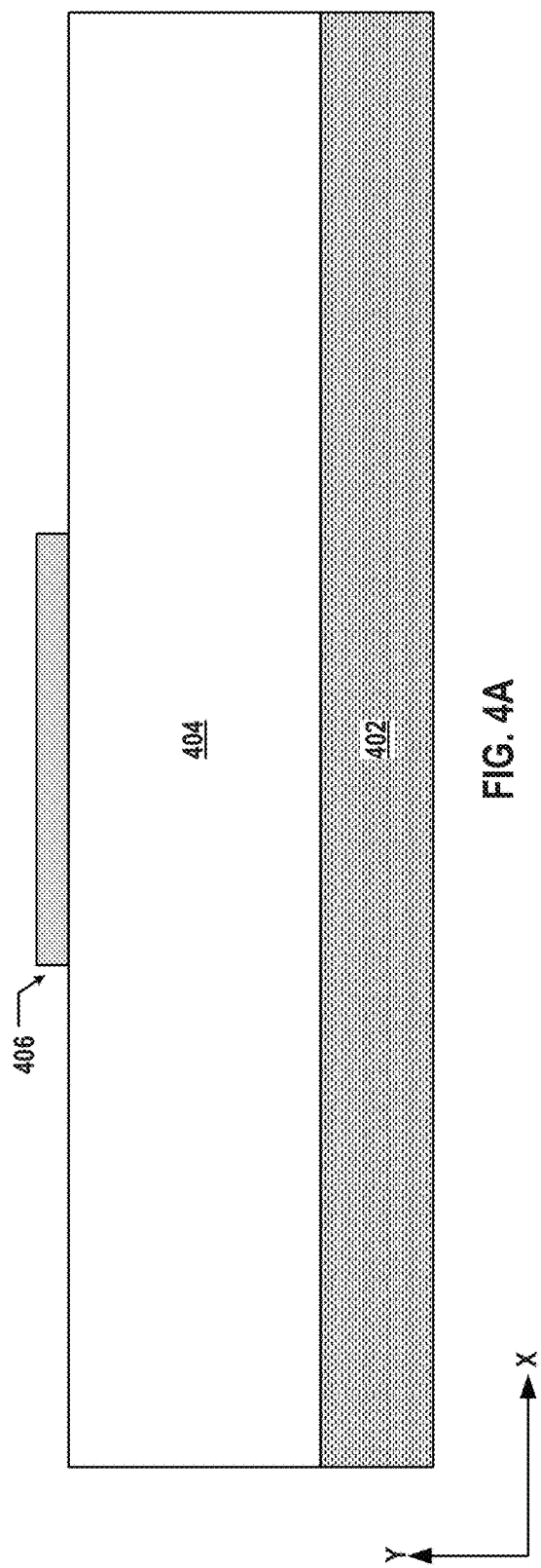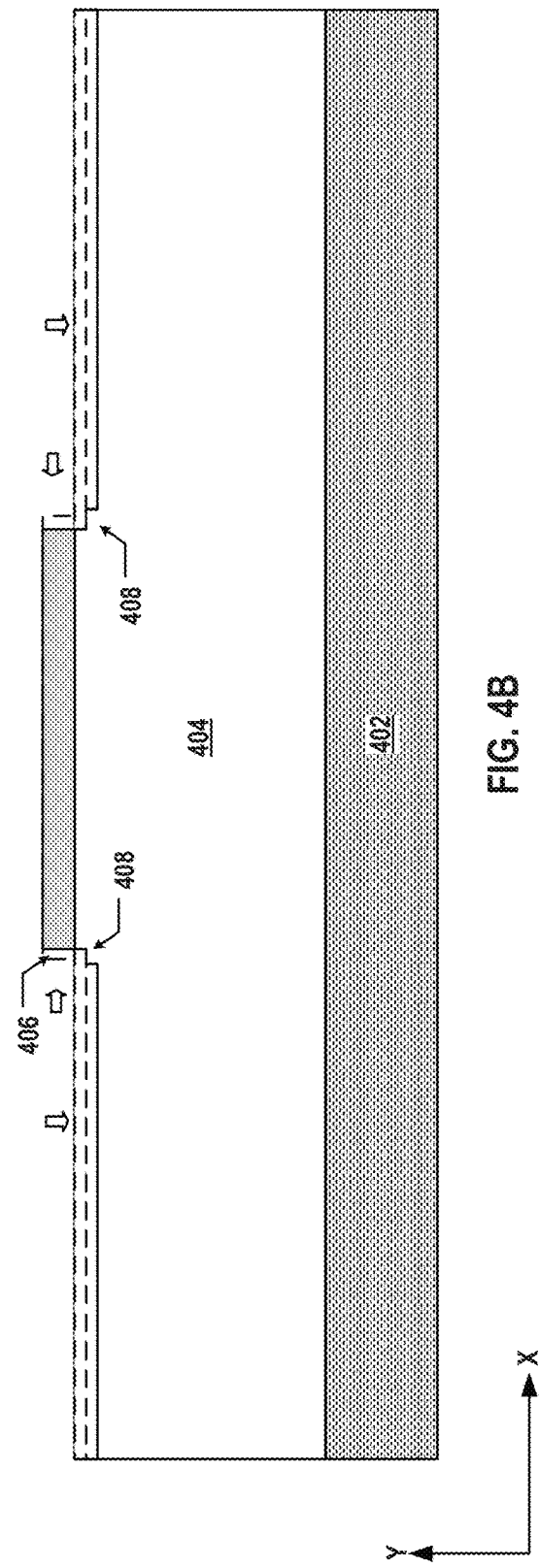

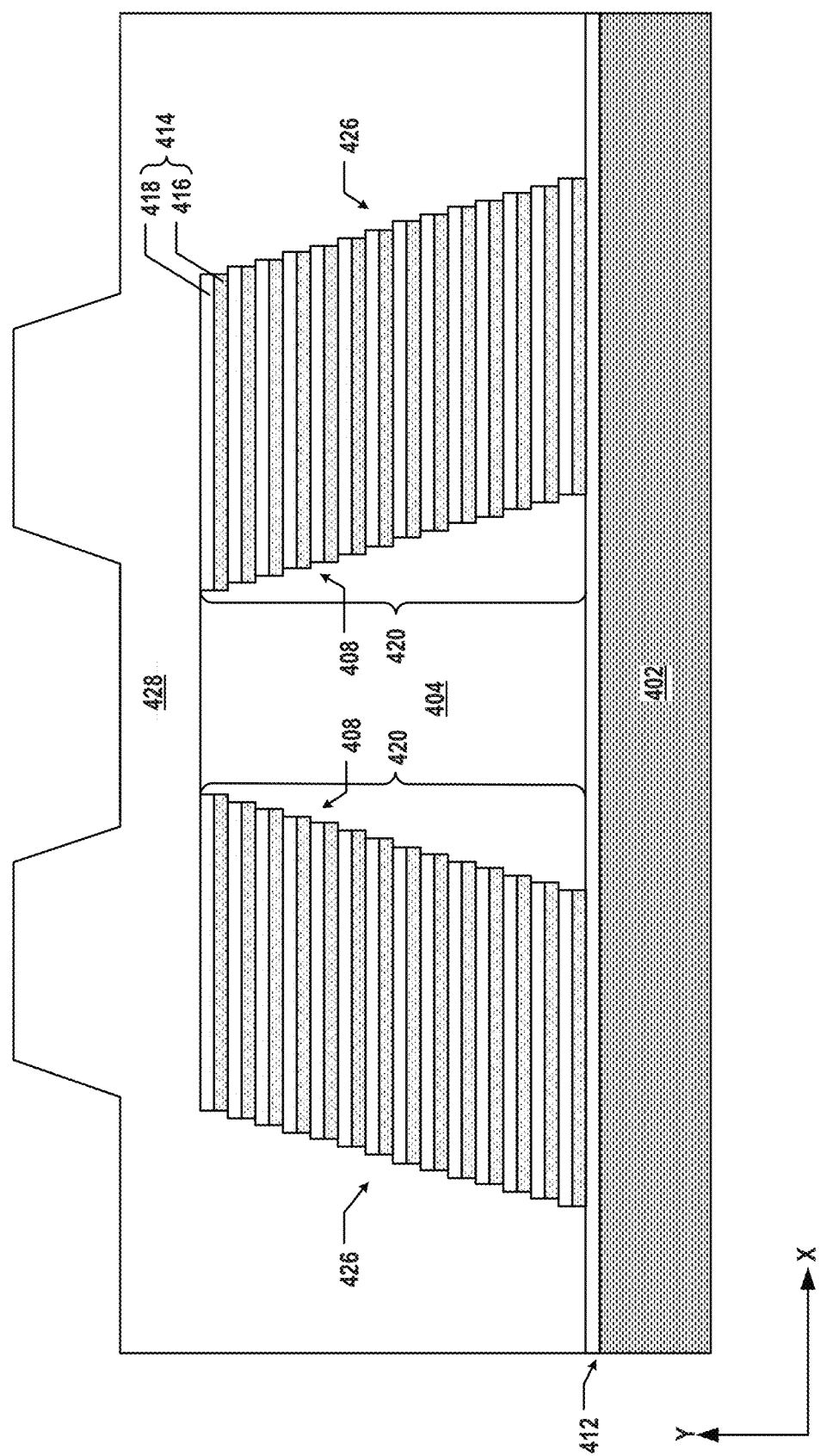

STAIRCASE STRUCTURES FOR THREE-DIMENSIONAL MEMORY DEVICE DOUBLE-SIDED ROUTING

CROSS REFERENCE TO RELATED APPLICATION

This application is continuation of International Application No. PCT/CN2018/093341, filed on Jun. 28, 2018, entitled "STAIRCASE STRUCTURES FOR THREE-DIMENSIONAL MEMORY DEVICE DOUBLE-SIDED ROUTING," which is hereby incorporated by reference in its entirety. This application is also related to U.S. application Ser. No. 16/139,001, filed on even date, entitled "METHOD OF FORMING STAIRCASE STRUCTURES FOR THREE-DIMENSIONAL MEMORY DEVICE DOUBLE-SIDED ROUTING," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of staircase structures for 3D memory device double-sided routing are disclosed herein.

In one example, a 3D memory device includes a substrate, a memory stack disposed above the substrate and including a plurality of conductor/dielectric layer pairs stacked alternatingly, and an array of memory strings each extending vertically through an inner region of the memory stack. An outer region of the memory stack includes a first staircase structure disposed on the substrate and a second staircase structure disposed on the substrate. First edges of the plurality of conductor/dielectric layer pairs in the first staircase structure along a vertical direction away from the substrate are staggered laterally toward the array of memory strings. Second edges of the plurality of conductor/dielectric layer pairs in the second staircase structure along the vertical direction away from the substrate are staggered laterally away from the array of memory strings.

In another example, a 3D memory device includes a substrate, a memory stack disposed above the substrate and including a plurality of conductor/dielectric layer pairs stacked alternatingly and staggered laterally, and an array of memory strings each extending vertically through the memory stack. A length of each of the plurality of conductor/dielectric layer pairs is the same.

In still another example, a 3D memory device includes a substrate, a memory stack disposed above the substrate and including a plurality of conductor/dielectric layer pairs stacked alternatingly, and an array of memory strings each extending vertically through an inner region of the memory stack. An outer region of the memory stack includes a staircase structure disposed on the substrate. Edges of the plurality of conductor/dielectric layer pairs in the staircase structure along the vertical direction away from the substrate are staggered laterally away from the array of memory strings. The 3D memory device also includes an interconnect layer disposed below the memory stack and a plurality of first via contacts each in contact with a conductor layer in one of the conductor/dielectric layer pairs in the staircase structure. The first via contacts each is electrically connected to the interconnect layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 4A-4H illustrate a fabrication process for forming an exemplary 3D memory device having staircase structures for double-sided routing, according to some embodiments.

Figure 1:
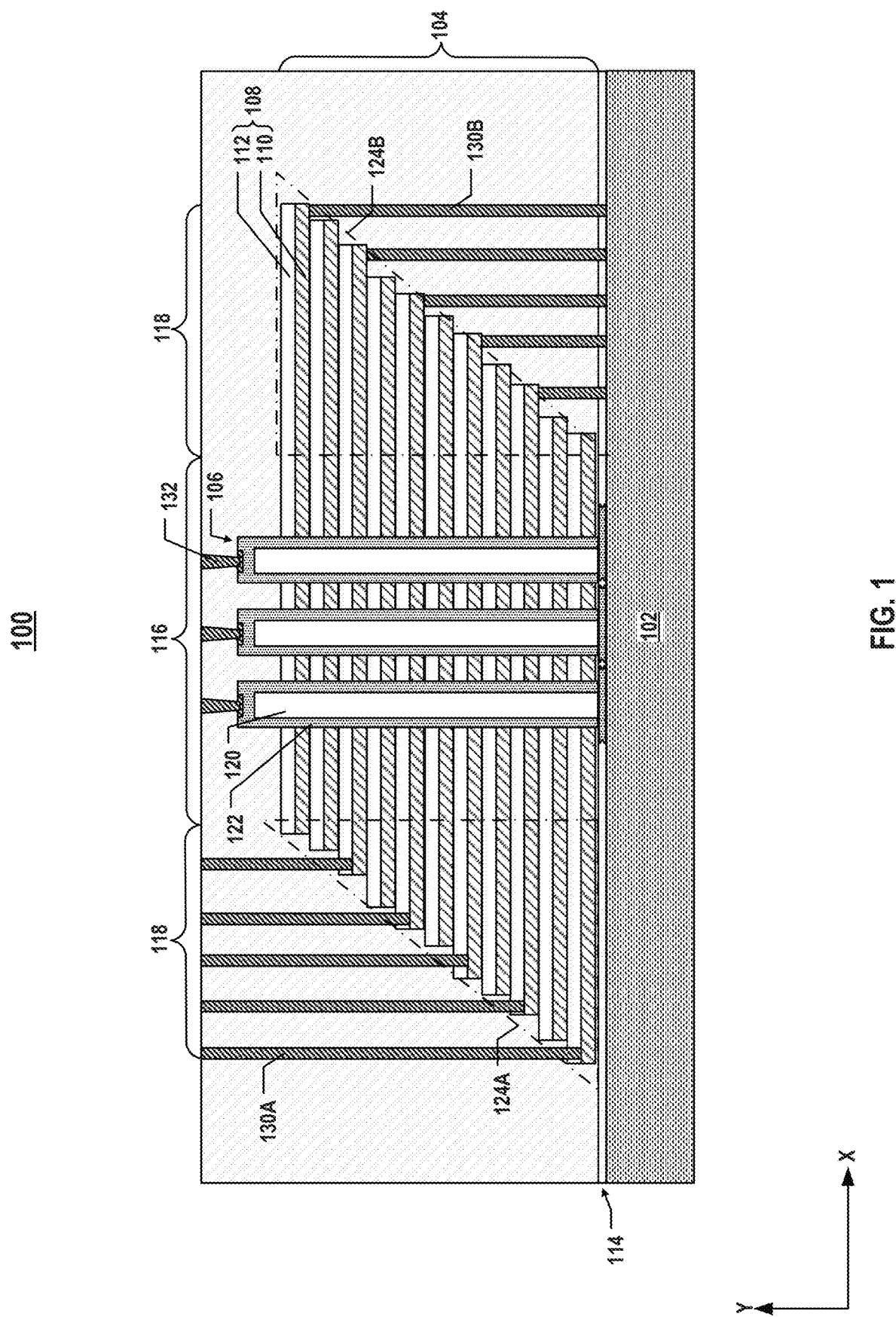
FIG. 1 illustrates a cross-section of an exemplary 3D memory device having staircase structures for double-sided routing, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, memory cells for storing data are vertically stacked through a stacked storage structure (e.g., a memory stack). 3D memory devices usually include staircase structures formed on one or more sides of the stacked storage structure for purposes such as word line fan-out. As the demand for higher storage capacity continues to increase, the number of vertical levels of the stacked storage structure also increases. The conventional staircase structures allow word line fan-out toward only one side of the substrate. That is, all the word line contacts have to land on the conventional staircases along the same vertical direction, which constrains interconnect routing and results in higher interconnect density and smaller process window.

Various embodiments in accordance with the present disclosure provide a 3D memory device having staircase structures for double-sided routing. The staircase structures disclosed herein allow interconnect routing (e.g., word line fan-out) toward both sides of the device substrate, thereby increasing routing flexibility, reducing interconnect density, and enlarging process window. In some embodiments, double-sided routing of a 3D memory device may also eliminate the need of certain interconnect structures with high aspect ratios, such as through array contacts (TACs), in the 3D memory device for back-end-of-line (BEOL) interconnects, which can further improve device yield.

FIG. 1 illustrates a cross-section of an exemplary 3D memory device 100 having staircase structures for double-sided routing, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), or any other suitable materials. In some embodiments, substrate 102 is a thinned substrate (e.g., a semiconductor layer), which was thinned from a normal thickness by grinding, wet/dry etching, chemical mechanical polishing (CMP), or any combination thereof.

3D memory device 100 can include a memory stack 104 above substrate 102. Memory stack 104 can be a stacked storage structure through which memory strings (e.g., NAND memory strings 106) are formed. In some embodiments, memory stack 104 includes a plurality of conductor/dielectric layer pairs 108 stacked vertically above substrate 102. Each conductor/dielectric layer pair 108 can include a conductor layer 110 and a dielectric layer 112. That is, memory stack 104 can include interleaved conductor layers 110 and dielectric layers 112 stacked vertically. As shown in FIG. 1, each NAND memory string 106 extends vertically through conductor/dielectric layer pairs 108 in memory stack 104. In some embodiments, 3D memory device 100 is a NAND Flash memory device in which memory cells are provided at intersections of NAND memory strings 106 and conductor layers 110 (functioning as word lines) of 3D memory device 100. The number of conductor/dielectric layer pairs 108 in memory stack 104 (e.g., 32, 64, 96, or 128) can set the number of memory cells in 3D memory device 100.

Conductor layers 110 can each have the same thickness or have different thicknesses. Similarly, dielectric layers 112 can each have the same thickness or have different thicknesses. Conductor layers 110 can include conductive materials including, but not limited to, tungsten (W), cobalt (Co), copper (Cu), aluminum (Al), polycrystalline silicon (polysilicon), doped silicon, silicides, or any combination thereof. Dielectric layers 112 can include dielectric materials including, but not limited to, silicon oxide, silicon nitride, silicon oxynitride, or any combination thereof. In some embodiments, conductor layers 110 include metals, such as W, and dielectric layers 112 include silicon oxide. It is understood that a silicon oxide film 114, such as an in-situ steam generation (ISSG) silicon oxide, is formed between substrate 102 (e.g., a silicon substrate) and memory stack 104, according to some embodiments.

It is noted that x and y axes are added to FIG. 1 to further illustrate the spatial relationship of the components in 3D memory device 100. Substrate 102 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 100) is determined relative to the substrate (e.g., substrate 102) of the semiconductor device in the y-direction (the vertical direction or thickness direction) when the substrate is positioned in the lowest plane of the semiconductor device in the y-direction. The same notion for describing spatial relationship is applied throughout the present disclosure.

In some embodiments, 3D memory device 100 is part of a monolithic 3D memory device, in which the components of the monolithic 3D memory device (e.g., memory cells and peripheral devices) are formed on a single substrate (e.g., substrate 102). Peripheral devices (not shown), such as any suitable digital, analog, and/or mixed-signal peripheral circuits used for facilitating the operation of 3D memory device 100, can be formed above memory stack 104. In some embodiments, 3D memory device 100 is part of a non-monolithic 3D memory device, in which the components are formed separately on different substrates and then bonded in a face-to-face manner, a face-to-back manner, or a back-to-back manner Peripheral devices (not shown) can be formed on a separate substrate different from substrate 102. As part of a bonded non-monolithic 3D memory device, substrate 102 can be a thinned substrate (e.g., a semiconductor layer, which is not the substrate of the bonded non-monolithic 3D memory device), and the back-end-of-line (BEOL) interconnects of the non-monolithic 3D memory device can be formed on the back side of thinned substrate 102.

Nevertheless, 3D memory device 100 can be part of a monolithic or non-monolithic 3D memory device regardless of whether 3D memory device 100 is above or below the peripheral devices (not shown). For ease of reference, FIG. 1 depicts a state of 3D memory device 100 in which substrate 102 is positioned below memory stack 104 in the y-direction, regardless of whether substrate 102 is a thinned substrate on which the BEOL interconnects of 3D memory device 100 can be formed.

As shown in FIG. 1, memory stack 104 can include an inner region 116 (also known as a "core array region") and an outer region 118 (also known as a "staircase region"). In some embodiments, inner region 116 is the center region of memory stack 104 where an array of NAND memory strings 106 are formed through conductor/dielectric layer pairs 108, and outer region 118 is the remaining region of memory stack 104 surrounding inner region 116 (including the sides and edges) without NAND memory strings 106. As shown in the plan view of FIG. 2, memory stack 104 can have a rectangle (or square) shape with inner region 116 in the center and outer region 118 (including the four sides and edges) surrounding inner region 116.

As shown in FIG. 1, each NAND memory string 106 can extend vertically through inner region 116 of memory stack 104. Each NAND memory string 106 can include a channel hole filled with semiconductor materials (e.g., forming a semiconductor channel 120) and dielectric materials (e.g., forming a memory film 122). In some embodiments, semiconductor channel 120 includes silicon, such as amorphous silicon, polysilicon, or single crystalline silicon. In some embodiments, memory film 122 is a composite layer including a tunneling layer, a storage layer (also known as a "charge trap/storage layer"), and a blocking layer. Each NAND memory string 106 can have a cylinder shape (e.g., a pillar shape). Semiconductor channel 120, the tunneling layer, the storage layer, and the blocking layer are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof.

In some embodiments, NAND memory strings 106 include a plurality of control gates (each being part of a word line/conductor layer 110) for NAND memory strings 106. Conductor layer 110 in each conductor/dielectric layer pair 108 can function as a control gate for memory cells of NAND memory string 106. Conductor layer 110 can include multiple control gates for multiple NAND memory strings 106 and can extend laterally as a word line ending at the edge of memory stack 104. It is understood that although not shown in FIG. 1, additional components of 3D memory device 100 can be formed as part of NAND memory strings 106 and/or memory stack 104 including, but not limited to, array common sources, drains, source select gates, drain select gates, and gate line slits/source contacts.

As shown in FIG. 1, at least on two sides in the lateral direction, outer region 118 of memory stack 104 can include multiple staircase structures 124A and 124B. In some embodiments, memory stack 104 includes a first staircase structure 124A and a second staircase structure 124B both on substrate 102. First staircase structure 124A and second staircase structure 124B can be on opposite sides in the lateral direction of memory stack 104.

In staircase structure 124A, the edges of conductor/dielectric layer pairs 108 along the vertical direction away from substrate 102 (the positive y-direction) can be staggered laterally toward array of NAND memory strings 106 of memory stack 104. In other words, the edges of memory stack 104 in staircase structure 124A can be tilted toward inner region 116 as moving away from substrate 102 (from bottom to top). The slope of staircase structure 124A can face away from substrate 102.

On the other hand, in staircase structure 124B, the edges of conductor/dielectric layer pairs 108 along the vertical direction away from substrate 102 (the positive y-direction) can be staggered laterally away from array of NAND memory strings 106 of memory stack 104. In other words, the edges of memory stack 104 in staircase structures 124B can be tilted away from inner region 116 as moving away from substrate 102 (from bottom to top). The slope of staircase structure 124B can face toward substrate 102.

Consequently, as shown in FIG. 1, memory stack 104 can have a substantially parallelogram shape in the side view (disregarding the "sawtooth" on the sides). Conductor/dielectric layer pairs 108 in memory stack 104 can be staggered laterally, and the length of each conductor/dielectric layer pair 108 in memory stack 104 can be nominally the same. In some embodiments, the numbers of conductor/dielectric layer pairs 108 in first and second staircase structures 124A and 124B are the same.

Each "level" of staircase structure 124A or 124B can include one or more conductor/dielectric layer pairs 108, each including a pair of conductor layer 110 and dielectric layer 112. As shown in FIG. 1, each level of staircase structure 124 includes one conductor/dielectric layer pair 108, according to some embodiments. The edges of each adjacent conductor/dielectric layer pairs 108 can be staggered laterally. For example, the edges of each adjacent conductor/dielectric layer pairs 108 in first staircase structure 124A from bottom to top are staggered laterally toward array of NAND memory strings 106, and the edges of each adjacent conductor/dielectric layer pairs 108 in second staircase structure 124B from bottom to top are staggered laterally away from NAND memory strings 106. It is understood that in some embodiments, each level of staircase structure 124A or 124B can include multiple conductor/dielectric layer pairs 108 each having nominally the same length.

As shown in FIG. 1, the bottom layer in each level of staircase structure 124A or 124B (e.g., each conductor/dielectric layer pair 108 in FIG. 1) can be conductor layer 110 for interconnection in the vertical directions. It is understood that in some embodiments, the top layer in each level of staircase structure is conductor layer 110. In some embodiments, each two adjacent levels of staircase structure 124A or 124B are offset by a nominally same distance in the vertical direction and a nominally same distance in the lateral direction. Each offset thus can form a "landing area" for interconnection with the word lines of 3D memory device 100 in the vertical direction. As shown in FIG. 1, the offset of the edges of each adjacent conductor/dielectric layer pairs 108 in each staircase structure 124A or 124B is nominally the same, according to some embodiments.

Figure 2:
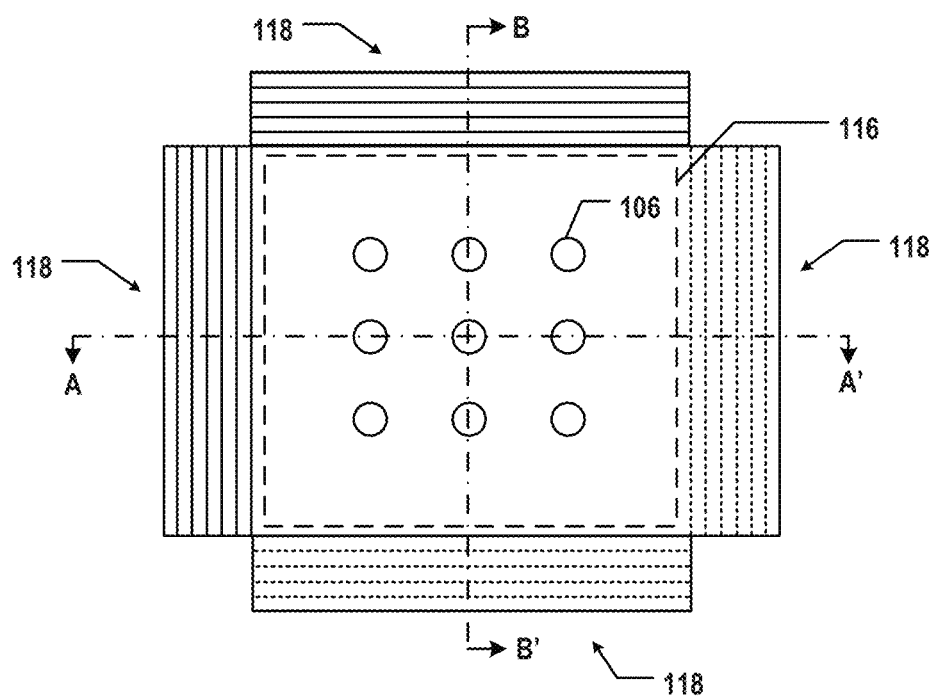
FIG. 2 illustrates a plan view of an exemplary memory stack in a 3D memory device, according to some embodiments.

Referring to the plan view of FIG. 2, memory stack 104 has staircase structures on four sides of outer region 118, according to some embodiments. FIG. 1 illustrates the cross-section of memory stack 104 along the A-A' direction with two staircase structures 124A and 124B on two opposite sides. In some embodiments, outer region 118 of memory stack 104 further includes two staircase structures along the B-B' direction on another two opposite sides, which have the similar design and configuration as staircase structures 124A and 124B in FIG. 1. For example, the cross-section of memory stack 104 along the B-B' direction can also have a substantially parallelogram shape in the side view. The details of the two staircase structures along the B-B' direction will not be repeated. A staircase structure can be either a functional staircase structure used for landing interconnects (e.g., via contacts) and/or dummy channel holes or a dummy staircase structure used for balancing load in etch/CMP processes during fabrication. In some embodiments, the staircase structures along the A-A' direction (e.g., staircase structures 124A and 124B in FIG. 1) are functional staircase structures, while the staircase structures along the B-B's direction are dummy staircase structures.

Referring back to FIG. 1, 3D memory device 100 can include a plurality of local interconnects in contact with the various memory stack components disclosed herein, such as NAND memory strings 106 and word lines 110 in staircase structures 124. The interconnects are referred to herein as "local interconnects" as they are in contact with the components in memory stack 104 directly for fan-out. As used herein, the term "interconnects" can broadly include any suitable types of interconnects, including vertical interconnect access (e.g., via) contacts and lateral interconnect lines. As shown in FIG. 1, local interconnects can include word line via contacts 130 and NAND memory string via contacts 132. Each local interconnect can include an opening (e.g., a via hole or a trench) filled with conductive materials including, but not limited to, W, Co, Cu, Al, silicides, or any combination thereof.

The parallelogram-shaped memory stack 104 shown in FIG. 1 can allow double-sided interconnect routing for 3D memory device 100, such as double-sided word line fan-out using two staircase structures 124A and 124B whose slopes facing toward opposite directions. Interconnect routing thus can be achieved at opposite sides of substrate 102. In some embodiments, word line via contacts 130 include a first set of word line via contacts 130A for word line fan-out away from substrate 102 (the positive y-direction) and include a second set of word line via contacts 130B for word line fan-out toward substrate 102 (the negative y-direction). For first set of word line via contacts 130A, each of them can be in contact with conductor layer 110 (word line) in one of conductor/dielectric layer pairs 108 in first staircase structure 124A. Similarly, for second set of word line via contacts 130B, each of them can be in contact with conductor layer 110 (word line) in one of conductor/dielectric layer pairs 108 in second staircase structure 124B.

As each word line 110 can be fanned-out by one of the staircase structures on either side, for each staircase structure 124A or 124B, not all of the landing areas need to be used for contacting word line via contact 130. In some embodiments, each staircase structure 124A or 124B is used to fan-out one half of word lines 110. For example, word lines 110 can be alternatingly fanned-out by two staircase structures 124A and 124B.

The parallelogram-shaped memory stack 104 shown in FIG. 1 can allow double-sided interconnect routing for 3D memory device 100, which in turn can allow interconnect layers (e.g., BEOL interconnects) at either one or both sides of substrate 102 to be electrically connected to the components (e.g., word lines 110) in memory stack 104 by the local interconnects (e.g., word line via contacts 130). For example, FIGS. 3A-3B illustrate cross-sections of 3D memory device 100 having staircase structures 124 for double-sided routing to interconnect layers, according to various embodiments.

Figure 3A:
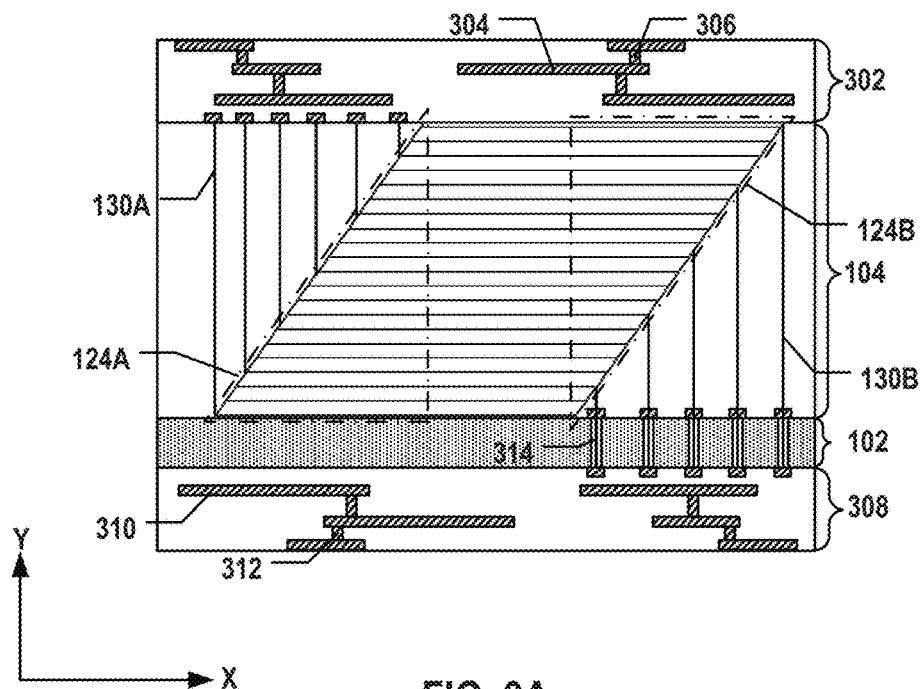
FIG. 3A illustrates a cross-section of an exemplary 3D memory device having staircase structures for double-sided routing to interconnect layers, according to some embodiments.
Figure 3B:
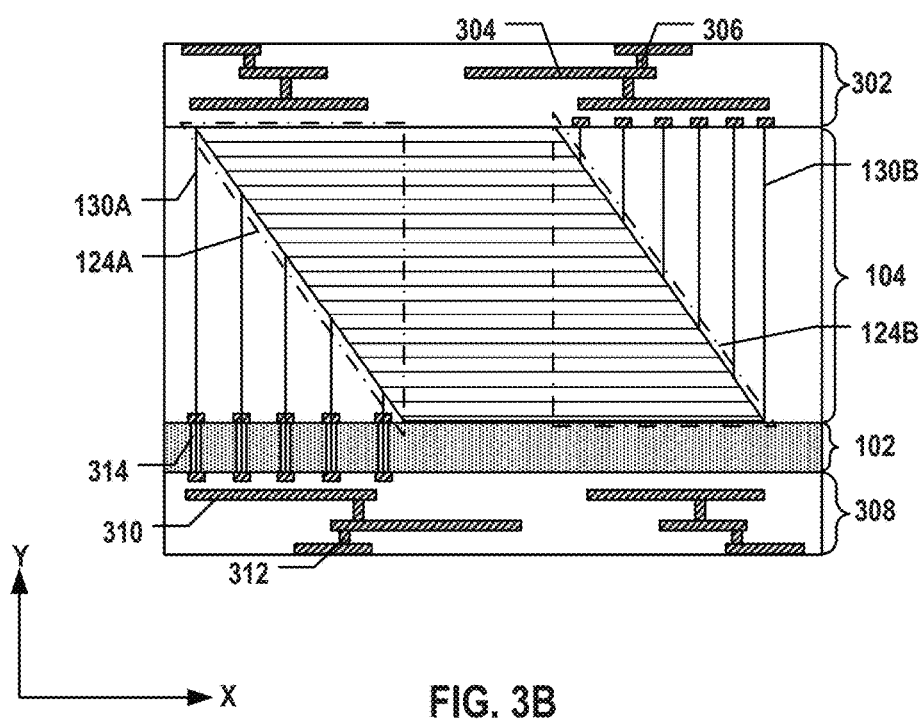
FIG. 3B illustrates a cross-section of another exemplary 3D memory device having staircase structures for double-sided routing to interconnect layers, according to some embodiments.

As shown in FIG. 3A, 3D memory device 100 can include a front-side interconnect layer 302 above memory stack 104 and at the front side of substrate 102 where memory stack 104 is formed. Front-side interconnect layer 302 can include interconnect lines 304 and via contacts 306 and one or more interlayer dielectric (ILD) layers (also known as "intermetal dielectric (IMD) layers") in which interconnect lines 304 and via contacts 306 can form. The interconnects (e.g., interconnect lines 304 and via contacts 306) and the ILD layers can be collectively referred to herein as an "interconnect layer" (e.g., front-side interconnect layer 302). Interconnect lines 304 and via contacts 306 can include conductive materials including, but not limited to, W, Co, Cu, Al, silicides, or any combination thereof. The ILD layers in front-side interconnect layer 302 can include dielectric materials including, but not limited to, silicon oxide, silicon nitride, silicon oxynitride, low dielectric constant (low-k) dielectrics, or any combination thereof.

In some embodiments, one end (e.g., the lower end) of each word line via contact 130A is in contact with a word line in staircase structure 124A, and another end (e.g., the upper end) of each word line via contact 130A is in contact with the interconnects in front-side interconnect layer 302. That is, front-side interconnect layer 302 can be electrically connected to the word lines in staircase structure 124A of memory stack 104. As used herein, the "upper end" of a component (e.g., word line via contact 130) is the end farther away from substrate 102 in the y-direction, and the "lower end" of the component is the end closer to substrate 102 in the y-direction.

As shown in FIG. 3A, 3D memory device 100 can also include a back-side interconnect layer 308 below memory stack 104 and at the back side of substrate 102. That is, back-side interconnect layer 308 and memory stack 104 can be formed at opposite sides of substrate 102. Back-side interconnect layer 308 can include interconnect lines 310 and via contacts 312 and one or more ILD layers in which interconnect lines 310 and via contacts 312 can form. The interconnects (e.g., interconnect lines 310 and via contacts 312) and the ILD layers can be collectively referred to herein as an "interconnect layer" (e.g., back-side interconnect layer 308). Interconnect lines 310 and via contacts 312 can include conductive materials including, but not limited to, W, Co, Cu, Al, silicides, or any combination thereof. The ILD layers in back-side interconnect layer 308 can include dielectric materials including, but not limited to, silicon oxide, silicon nitride, silicon oxynitride, low k dielectrics, or any combination thereof.

In some embodiments, one end (e.g., the upper end) of each word line via contact 130B is in contact with a word line in staircase structure 124B, and another end (e.g., the lower end) of each word line via contact 130B is in contact with a via contact 314 extending through substrate 102 (e.g., a through silicon via (TSV)). Via contacts 314 can be in contact with the interconnects in back-side interconnect layer 308. As a result, back-side interconnect layer 308 can be electrically connected to the word lines in staircase structure 124B of memory stack 104 by word line via contacts 130B and via contacts 314 through substrate 102. It is understood that in some embodiments, substrate 102 is a thinned substrate for ease of forming via contacts 314 and back-side interconnect layer 308.

It is understood that memory stack 104 can be flipped laterally in the side view as shown in FIG. 3B. Consequently, the edges of conductor/dielectric layer pairs 108 in first staircase structure 124A along the vertical direction away from substrate 102 can be staggered laterally away from array of memory strings 106, and the edges of conductor/dielectric layer pairs 108 in second staircase structure 124B along the vertical direction away from substrate 102 can be staggered laterally toward array of memory strings 106. In other words, the edges of memory stack 104 in first staircase structure 124A can be tilted away from inner region 116 as moving away from substrate 102 (from bottom to top), and the edges of memory stack 104 in second staircase structure 124B can be tilted toward inner region 116 as moving away from substrate 102 (from bottom to top). The slope of first staircase structure 124A can face toward substrate 102, and the slope of second staircase structure 124B can face away from substrate 102. Thus, first staircase structure 124A can be used to fan-out one half of the word lines of memory stack 104 to back-side interconnect layer 308, and second staircase structure 124B can be used to fan-out one half of the word lines of memory stack 104 to front-side interconnect layer 302.

FIGS. 4A-4H illustrate a fabrication process for forming an exemplary 3D memory device having staircase structures for double-sided routing, according to some embodiments of the present disclosure. FIG. 5 is a flowchart of a method 500 for forming an exemplary 3D memory device having staircase structures for double-sided routing, according to some embodiments. Examples of the 3D memory device depicted in FIGS. 4A-4H and FIG. 5 include 3D memory device 100 depicted in FIG. 1. FIGS. 4A-4H and FIG. 5 will be described together. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a first dielectric layer is formed on a substrate, and a first photoresist layer is formed on the first dielectric layer. The substrate can be a silicon substrate. In some embodiments, prior to forming the first dielectric layer, the substrate is doped by ion implantation and/or thermal diffusion to form doping regions (e.g., wells) and is oxidized to form a silicon oxide film (e.g., ISSG silicon oxide). In some embodiments, isolation regions (e.g., shallow trench isolations (STIs)) are also formed in the substrate by wet/dry etch and thin film deposition. Forming the first dielectric layer can include depositing a silicon oxide film on the substrate.

As illustrated in FIG. 4A, a dielectric layer 404 is formed on a silicon substrate 402. Dielectric layer 404 can include silicon oxide, such as tetraethyl orthosilicate (TEOS) silicon oxide, or any other dielectric materials including, but not limited to, silicon nitride, silicon oxynitride, or any combination thereof. Dielectric layer 404 can be formed by one or more thin film deposition processes including, but not limited to, chemical vapor deposition (CVD), physical vapor deposition (PVD), atomic layer deposition (ALD), spin coating, or any combination thereof. A photoresist layer 406 is formed on dielectric layer 404 by spin coating. Photoresist layer 406 can be any suitable type of positive or negative photoresist. In some embodiments, an ISSG silicon oxide film is formed between dielectric layer 404 and silicon substrate 402, and a bottom anti-reflection coating (BARC) film is formed between dielectric layer 404 and photoresist layer 406.

Method 500 proceeds to operation 504, as illustrated in FIG. 5, in which a recess is patterned through the first dielectric layer to the substrate by a plurality cycles of trimming the first photoresist layer and etching the first dielectric layer. In some embodiments, patterning the recess includes patterning the first photoresist layer to expose a portion of the first dielectric layer, and etching the exposed portion of the first dielectric layer using the patterned first photoresist layer as an etch mask. In each trim-etch cycle, the first photoresist layer is trimmed to enlarge the exposed portion of the first dielectric layer, and the enlarged exposed portion of the first dielectric layer is etched using the trimmed first photoresist layer as another etch mask to form a step structure at an edge of the recess, according to some embodiments. The trim-etch cycle can be repeated until the etching reaches the substrate and results in a plurality of step structures at the edge of the recess. In some embodiments, the amount of the trimmed first photoresist layer is nominally the same in each trim-etch cycle, and the width of each step structure is nominally the same as well.

As illustrated in FIG. 4B, photoresist layer 406 is patterned to expose portions of dielectric layer 404. Photoresist layer 406 can be patterned by photolithography and development. Patterned photoresist layer 406 is used as an etch mask to etch the exposed portions of dielectric layer 404 by wet etch and/or dry etch. Any suitable etchants (e.g., of wet etch and/or dry etch) can be used to remove a certain thickness of dielectric layer 404 (and the entire thickness of BARC film if any) in the exposed portions. The etched thickness can be controlled by etch rate and/or etch time. Patterned photoresist layer 406 is then trimmed (e.g., etched incrementally and inwardly, often from all directions) to enlarge the exposed portions of dielectric layer 404 (as indicated by the lateral arrows). The amount of photoresist layer 406 trimmed can be controlled by trim rate and/or trim time and can be directly relevant (e.g., determinant) to the dimensions of the resulting step structures 408. The trim of photoresist layer 406 can be performed using any suitable etch process, e.g., an isotropic dry etch or a wet etch. The enlarged exposed portions of dielectric layer 404 are etched again using trimmed photoresist layer 406 as an etch mask to form one step structure 408. Any suitable etchants (e.g., of wet etch and/or dry etch) can be used to remove a certain thickness of dielectric layer 404 toward silicon substrate 402 (as indicated by the vertical arrows), which can be controlled by etch rate and/or etch time. The trim process of photoresist 406 followed by the etch process of dielectric layer 404 is referred to herein as a trim-etch cycle of dielectric layer 404.

Figure 4C:
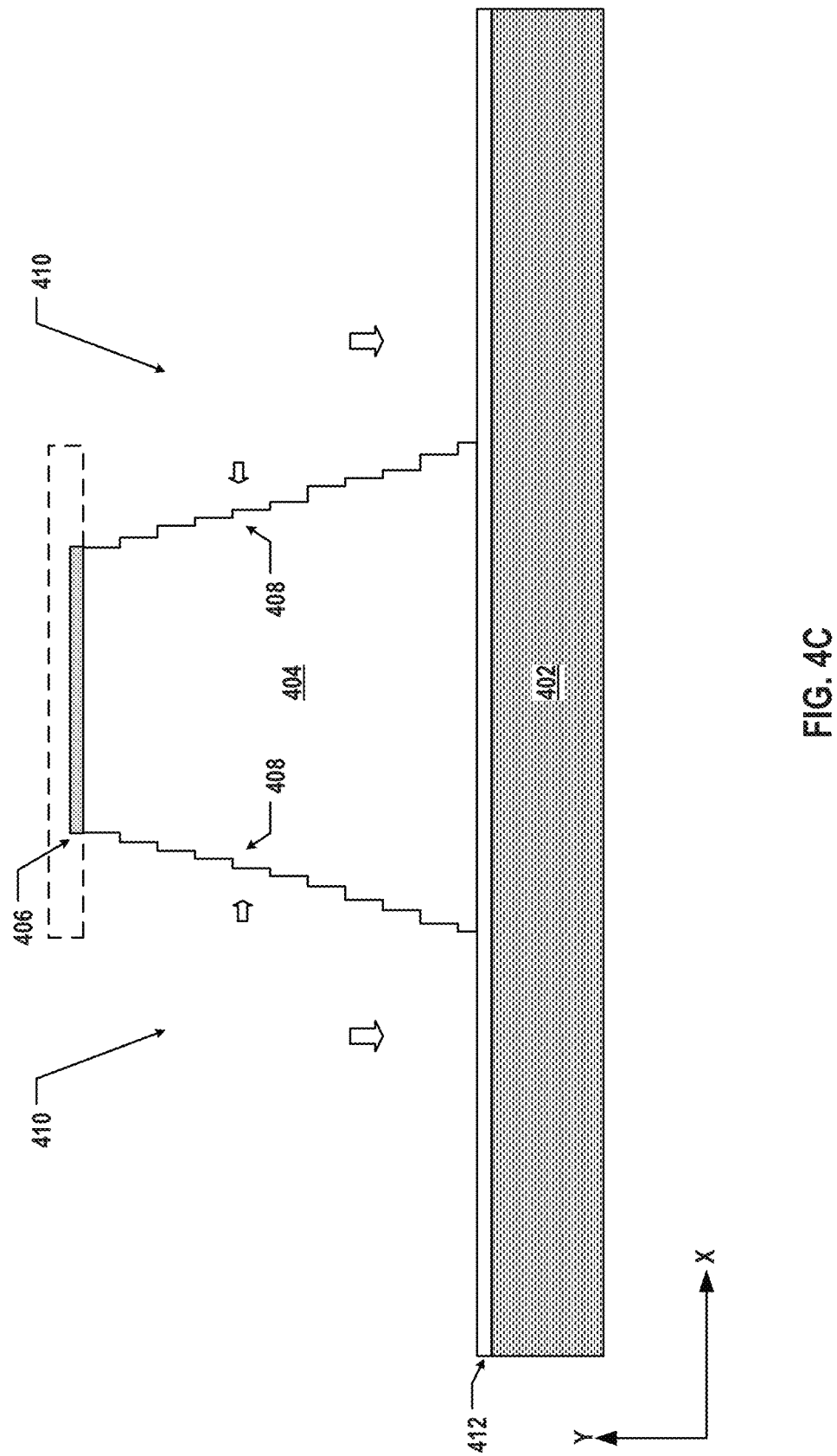
Figure 5:
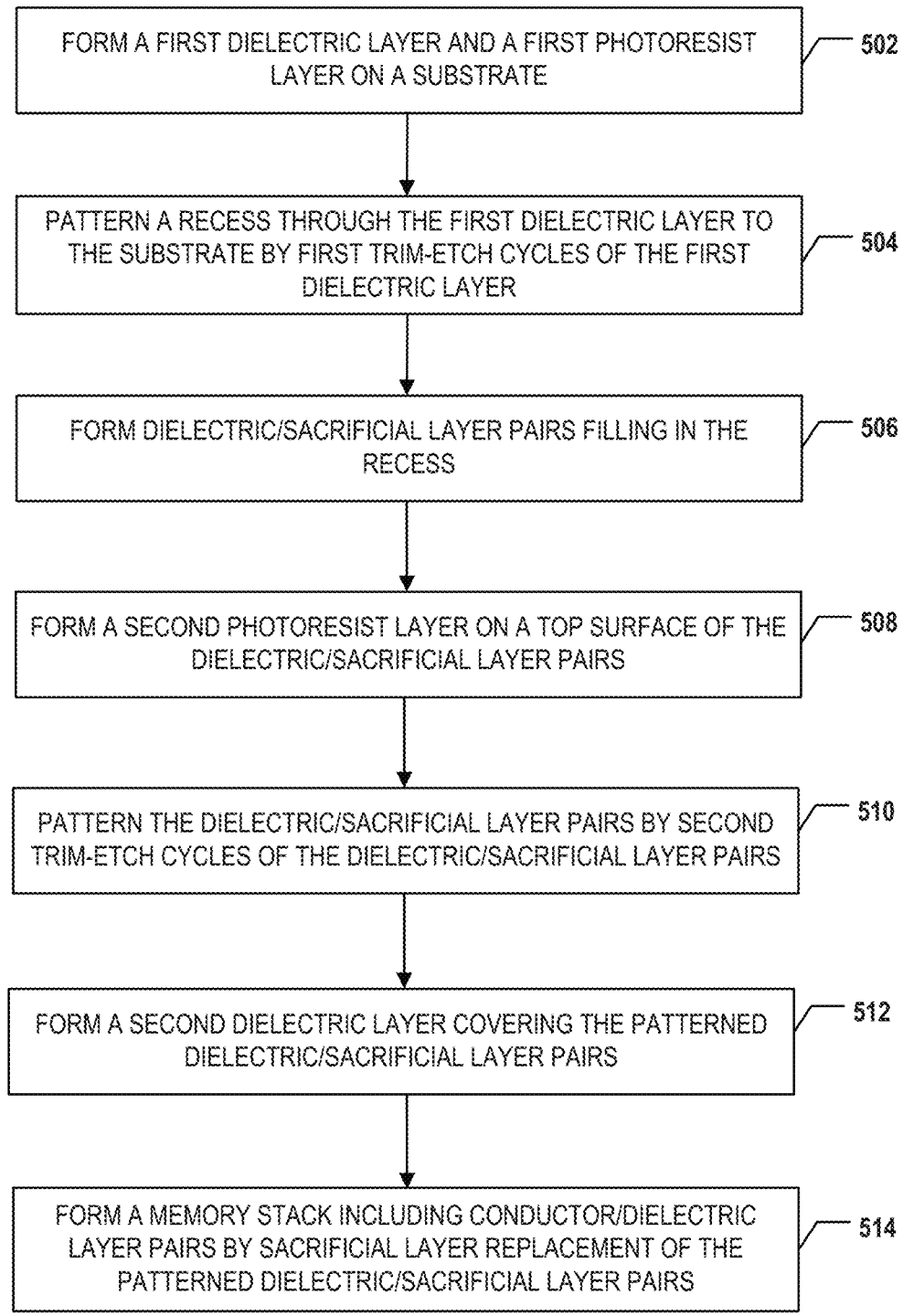
FIG. 5 is a flowchart of a method for forming an exemplary 3D memory device having staircase structures for double-sided routing, according to some embodiments.

As illustrated in FIG. 4C, the trim-etch cycle of dielectric layer 404 is repeated until the etching reaches silicon substrate 402. Consequently, recesses 410 are formed through dielectric layer 404 to silicon substrate 402 with a plurality of step structures 408 at the edges of recesses 410. Due to the repeated trim-etch cycles of dielectric layer 404, recess 410 can have a tilted side edge and a top aperture larger than the bottom aperture. That is, the aperture of recess 410 incrementally decreases as it goes toward silicon substrate 402. The number of step structures 408 can be determined by the number of trim-etch cycles of dielectric layer 404. The dimensions of each step structure 408 can be determined by the amount of trimmed photoresist layer 406 in each cycle (e.g., determining the width in the lateral direction) and by the thickness of etched dielectric layer 404 in each cycle (e.g., determining the depth/height in the vertical direction). In some embodiments, the amount of trimmed photoresist layer 406 in each cycle is nominally the same, so that the width of each step structure 408 is nominally the same. In some embodiments, the thickness of etched dielectric layer 404 in each cycle is nominally the same, so that the depth/height of each step structure 408 is nominally the same.

As illustrated in FIG. 4C, after recess 410 is patterned, remaining photoresist layer 406 is removed, for example, by polymer ashing, photoresist stripping, and/or wet clean, to clean the outer surfaces (e.g., the top surface and the side edges of recesses 410) of dielectric layer 404. A silicon oxide film 412 can be formed to cover silicon substrate 402 exposed at the bottom of recess 410. In some embodiments, silicon oxide film 412 is formed by ISSG oxidation of silicon substrate 402, high density plasma (HDP) oxidation deposition, and/or fluorine silicon glass (FSG) oxidation deposition. In some embodiments, silicon oxide film 412 covers not only the bottom of recess 410, but also the outer surfaces (e.g., the top surface and the side edges of recesses 410) of dielectric layer 404.

Method 500 proceeds to operation 506, as illustrated in FIG. 5, in which a plurality of dielectric/sacrificial layer pairs filling in the recess are formed. In some embodiments, forming the dielectric/sacrificial layer pairs includes alternatingly depositing dielectric layers and sacrificial layers. The thickness of each dielectric/sacrificial layer pair is nominally the same as the thickness of each step structure at the edge of the recess. Forming the dielectric/sacrificial layer pairs can also include planarizing the deposited dielectric layers and sacrificial layers until the top surface of the dielectric/sacrificial layer pairs is flush with a top surface of the first dielectric layer.

Figure 4D:
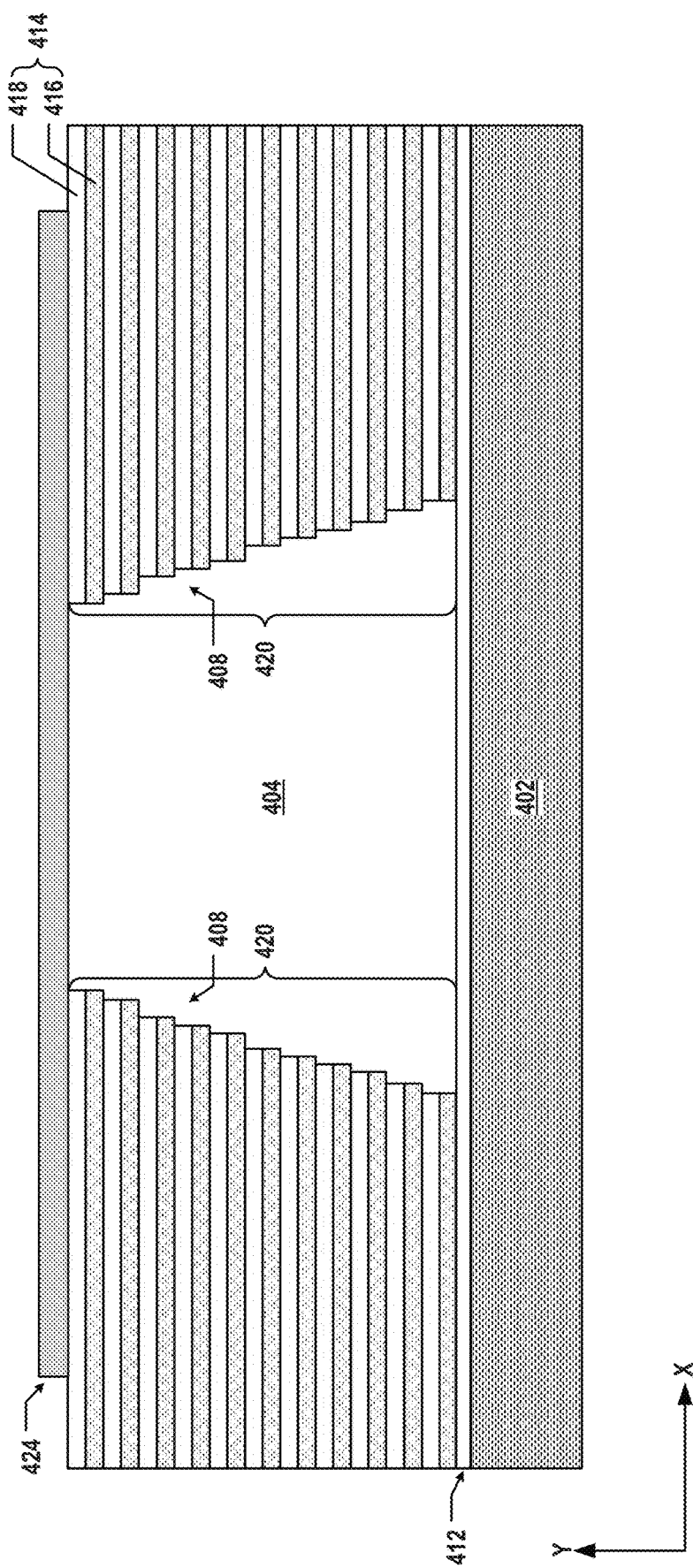

As illustrated in FIG. 4D, a plurality of dielectric/sacrificial layer pairs 414 are formed on the top surface of dielectric layer 404 (also referred to herein as "upper dielectric/sacrificial layer pairs," not shown) and filling in recesses 410 (also referred to herein as "lower dielectric/sacrificial layer pairs" 420). In some embodiments, sacrificial layers 416 and dielectric layers 418 are alternatingly deposited by one or more thin film deposition processes including, but not limited to, PVD, CVD, ALD, or any combination thereof. In some embodiments, sacrificial layers 416 include silicon nitride, and dielectric layers 418 include silicon oxide. The deposition rate and/or deposition time can be controlled such that the thickness of each dielectric/sacrificial layer pair 414 (including the total thickness of sacrificial layer 416 and dielectric layer 418) is nominally the same as the depth/height of each step structure 408 at the edges of recess 410. Consequently, lower dielectric/sacrificial layer pairs 420 can include a plurality of step structures 408 at the edges of lower dielectric/sacrificial layer pairs 420. It is understood that the sequence of depositing sacrificial layers 416 and dielectric layers 418 is not limited. The deposition can start with sacrificial layer 416 or dielectric layer 418 and can end with sacrificial layer 416 or dielectric layer 418.

As illustrated in FIG. 4D, the upper dielectric/sacrificial layer pairs are planarized by a plurality of processes until the top surface of the remaining dielectric/sacrificial layer pairs (e.g., lower dielectric/sacrificial layer pairs 420) is flush with the top surface of dielectric layer 404. That is, the upper dielectric/sacrificial layer pairs can be completely removed, and the planarization can stop at the top surface of lower dielectric/sacrificial layer pairs 420. For example, CMP and/or wet/dry etch can be used to remove the upper dielectric/sacrificial layer pairs.

Method 500 proceeds to operation 508, as illustrated in FIG. 5, in which a second photoresist layer is formed on the top surface of the dielectric/sacrificial layer pairs. As illustrated in FIG. 4D, photoresist layer 424 is formed on the top surface of lower dielectric/sacrificial layer pairs 420 (and dielectric layer 404) by spin coating and patterned by photolithography and development. Photoresist layer 424 can be any suitable type of positive or negative photoresist. In some embodiments, the same reticles as lower dielectric/sacrificial layer pairs 420 (and recesses 410) can be used, but with opposite photoresist patterns. In some embodiments, a BARC film is deposited between photoresist layer 424 and lower dielectric/sacrificial layer pairs 420 and similarly patterned as photoresist layer 424.

Method 500 proceeds to operation 510, as illustrated in FIG. 5, in which the dielectric/sacrificial layer pairs are patterned by a plurality cycles of trimming the second photoresist layer and etching the plurality of dielectric/sacrificial layer pairs. In some embodiments, patterning the dielectric/sacrificial layer pairs includes patterning the second photoresist layer to expose a portion of a first dielectric/sacrificial layer pair (e.g., the top dielectric/sacrificial layer pair), and etching the exposed portion of the first dielectric/sacrificial layer pair using the patterned second photoresist layer as an etch mask to expose a second dielectric/sacrificial layer pair (e.g., the one beneath the top dielectric/sacrificial layer pair). In each trim-etch cycle, the second photoresist layer is trimmed to expose another portion of the first dielectric/sacrificial layer pair, and the exposed portions of the first and second dielectric/sacrificial layer pairs are etched using the trimmed second photoresist layer as another etch mask to form a step structure at an edge of the dielectric/sacrificial layer pairs, according to some embodiments. The trim-etch cycle can be repeated until the etching reaches the substrate and results in a plurality of step structures at the edge of the dielectric/sacrificial layer pairs. In some embodiments, the amount of the trimmed second photoresist layer is nominally the same in each trim-etch cycle, and the width of each step structure is nominally the same as well.

As illustrated in FIG. 4D, photoresist layer 424 is patterned to expose portions of the top one of lower dielectric/sacrificial layer pairs 420. Patterned photoresist layer 424 is used as an etch mask to etch the exposed portions of the top one of lower dielectric/sacrificial layer pairs 420 by wet etch and/or dry etch. Any suitable etchants (e.g., of wet etch and/or dry etch) can be used to remove the entire thickness of the top one of dielectric/sacrificial layer pairs 414 in the exposed portions (including sacrificial layer 416 and dielectric layer 418 therein). The etched thickness can be controlled by etch-stop at different materials (e.g., silicon nitride and silicon oxide) used in dielectric/sacrificial layer pair 414. The etching of the exposed portions of the top one of lower dielectric/sacrificial layer pairs 420 results in the exposure of portions of the one beneath the top one of lower dielectric/sacrificial layer pairs 420.

Figure 4E:
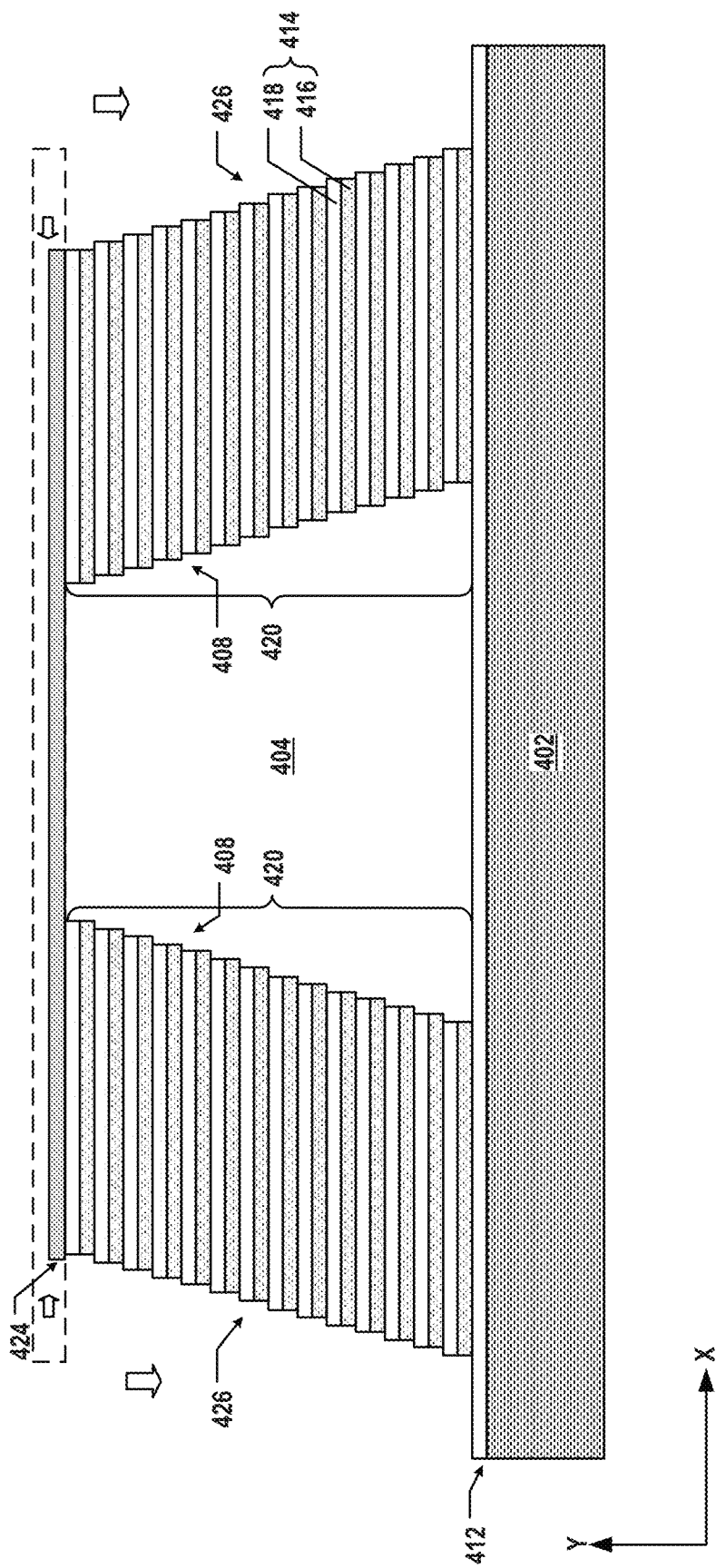

As illustrated in FIG. 4E, patterned photoresist layer 424 is then trimmed (e.g., etched incrementally and inwardly, often from all directions) to expose another portion of the top one of lower dielectric/sacrificial layer pairs 420 (as indicated by the lateral arrows). The amount of photoresist layer 424 trimmed can be controlled by trim rate and/or trim time and can be directly relevant (e.g., determinant) to the dimensions of the resulting step structure 426. The trim of photoresist layer 424 can be performed using any suitable etch process, e.g., an isotropic dry etch or a wet etch. Both the enlarged exposed portions of the top one of lower dielectric/sacrificial layer pairs 420 and the exposed portions of the one beneath the top one of lower dielectric/sacrificial layer pairs 420 are etched using trimmed photoresist layer 424 as an etch mask to form one step structure 426. Any suitable etchants (e.g., of wet etch and/or dry etch) can be used to remove the entire thickness of dielectric/sacrificial layer pair 414 in the exposed portions (including sacrificial layer 416 and dielectric layer 418 therein) toward silicon substrate 402 (as indicated by the vertical arrows). The trim process of photoresist layer 424 followed by the etch process of dielectric/sacrificial layer pair 414 is referred to herein as a trim-etch cycle of dielectric/sacrificial layer pair 414.

As illustrated in FIG. 4E, the trim-etch cycle of dielectric/sacrificial layer pair 414 is repeated until the etching reaches substrate 102 (or silicon oxide film 412 if any). Consequently, lower dielectric/sacrificial layer pairs 420 are patterned with a plurality of step structures 426 at the edge of lower dielectric/sacrificial layer pairs 420. Due to the repeated trim-etch cycles of dielectric/sacrificial layer pair 414, lower dielectric/sacrificial layer pairs 420 can have a tilted side edge where step structures 426 are formed. Consequently, lower dielectric/sacrificial layer pairs 420 can be staggered laterally, and the length of each one of lower dielectric/sacrificial layer pairs 420 can be nominally the same. The number of step structures 426 can be determined by the number of trim-etch cycles of dielectric/sacrificial layer pair 414. The dimensions of each step structure 426 can be determined by the amount of trimmed photoresist layer 424 in each cycle (e.g., determining the width in the lateral direction) and by the thickness of dielectric/sacrificial layer pair 414 (e.g., determining the depth/height in the vertical direction). In some embodiments, the amount of trimmed photoresist layer 424 in each cycle is nominally the same, so that the width of each step structure 426 is nominally the same. In some embodiments, the thickness of each dielectric/sacrificial layer pair 414 is nominally the same, so that the depth/height of each step structure 426 is nominally the same. In some embodiments, the dimensions (e.g., width and depth/height) of each step structure 426 at a tilted side edge of lower dielectric/sacrificial layer pairs 420 can be nominally the same as the dimensions (e.g., width and depth/height) of each step structure 408 at another tilted side edge of lower dielectric/sacrificial layer pairs 420.

Method 500 proceeds to operation 512, as illustrated in FIG. 5, in which a second dielectric layer covering the patterned plurality of dielectric/sacrificial layer pairs is formed. Forming the second dielectric layer can include depositing a silicon oxide film and planarizing the silicon oxide film.

Figure 4G:
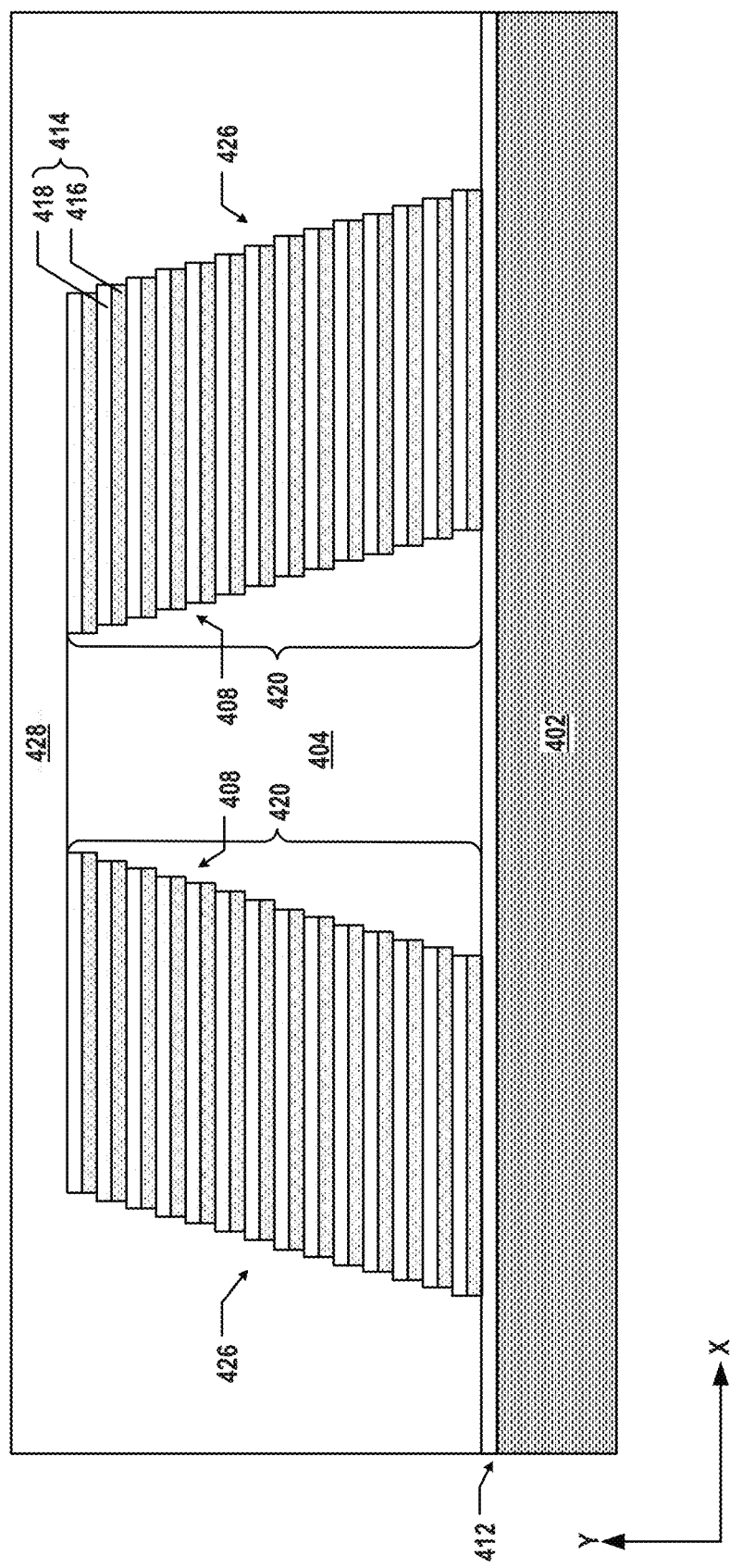

As illustrated in FIG. 4F, a dielectric layer 428 is formed on the top surface of dielectric layer 404 and covering patterned lower dielectric/sacrificial layer pairs 420. Dielectric layer 428 can include silicon oxide, such as TEOS silicon oxide, or any other dielectric materials including, but not limited to, silicon nitride, silicon oxynitride, or any combination thereof. Dielectric layer 428 can be formed by one or more thin film deposition processes including, but not limited to, CVD, PVD, ALD, spin coating, or any combination thereof. In some embodiments, an HDP and/or FSG silicon oxide film is deposited between dielectric layer 428 and dielectric layer 404 (and between dielectric layer 428 and patterned lower dielectric/sacrificial layer pairs 420). As illustrated in FIG. 4G, dielectric layer 428 is planarized by a plurality of processes. For example, a hard mask and a photoresist layer can be deposited and patterned by photolithography and wet/dry etch to fill in the gaps in dielectric layer 428, followed by CMP and/or wet/dry etch to remove excess dielectric layer 428. A certain thickness of dielectric layer 428 can remain after the planarization to cover the top surface of patterned lower dielectric/sacrificial layer pairs 420.

Method 500 proceeds to operation 514, as illustrated in FIG. 5, in which a memory stack including a plurality of conductor/dielectric layer pairs is formed on the substrate by replacing, with a plurality of conductor layers, the sacrificial layers in the patterned dielectric/sacrificial layer pairs. The process is also known as "gate replacement process." In some embodiments, the gate replacement process includes etching a plurality of openings through the dielectric/sacrificial layer pairs, etching the sacrificial layers in the dielectric/sacrificial layer pairs through the openings, and depositing the conductor layers in the conductor/dielectric layer pairs through the openings.

Figure 4H:
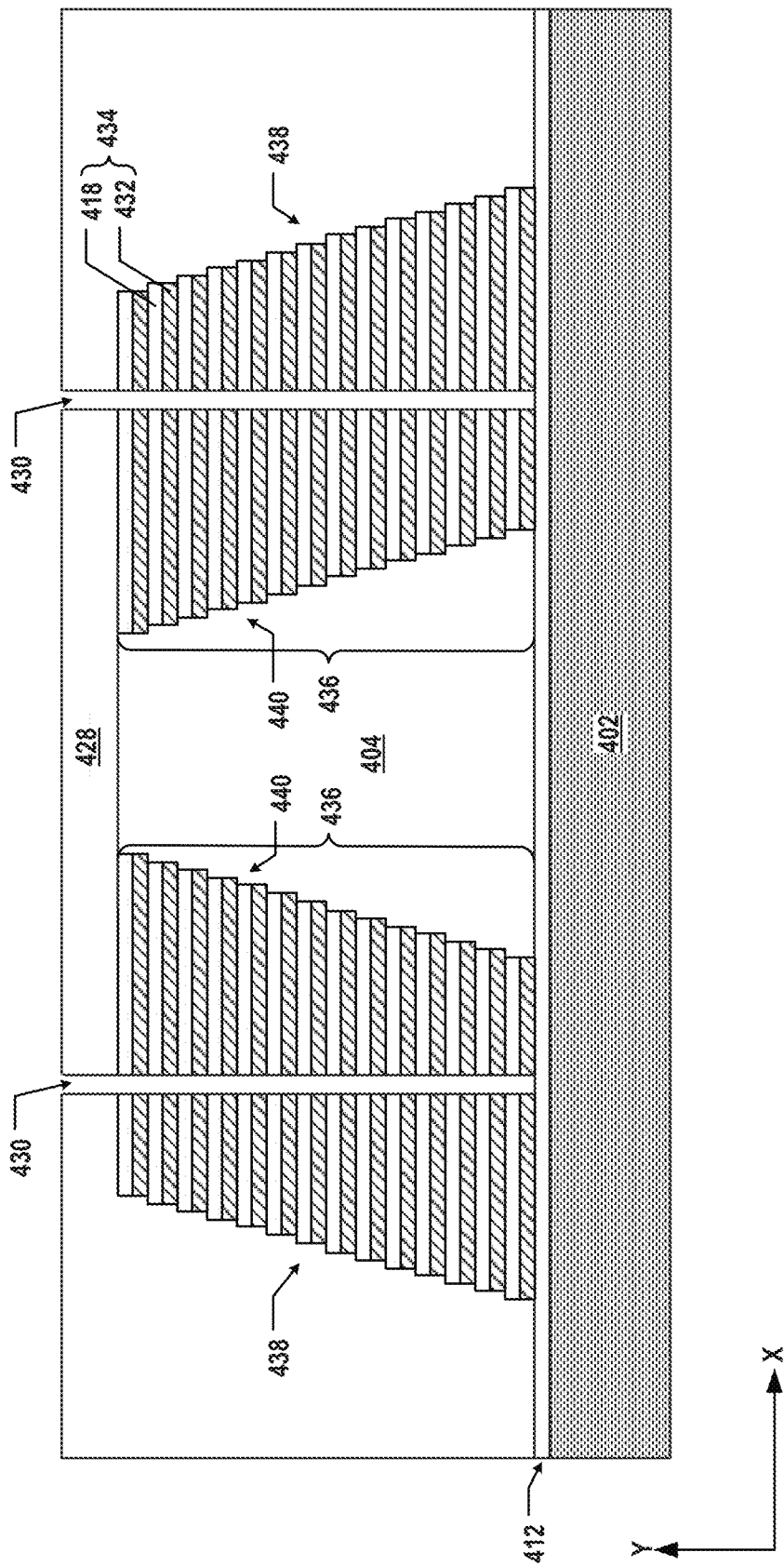

As illustrated in FIG. 4H, openings 430 (e.g., gate line slits) are etched through patterned lower dielectric/sacrificial layer pairs 420. Openings 430 can be formed by wet etching and/or dry etching of dielectrics (e.g., silicon oxide and silicon nitride). Openings 430 are used as pathways for gate replacement process that replaces sacrificial layers 416 in patterned lower dielectric/sacrificial layer pairs 420 with conductor layers 432 to form a plurality of conductor/dielectric layer pairs 434. The replacement of sacrificial layers 416 with conductor layers 432 can be performed by wet etching sacrificial layers 416 (e.g., silicon nitride) selective to dielectric layers 418 (e.g., silicon oxide) and filling the structure with conductor layers 432 (e.g., W). Conductor layers 432 can be deposited by PVD, CVD, ALD, any other suitable process, or any combination thereof. Conductor layers 432 can include conductive materials including, but not limited to, W, Co, Cu, Al, polysilicon, silicides, or any combination thereof.

As a result, after the gate replacement process, patterned lower dielectric/sacrificial layer pairs 420 in FIG. 4G become part of a memory stack 436 (e.g., memory stack 104 in FIG. 1) having a substantially parallelogram shape in the side view. Step structures 426 at one side edge of patterned lower dielectric/sacrificial layer pairs 420 in FIG. 4G become a staircase structure 438 of memory stack 436 (e.g., first staircase structure 124A in FIG. 1), and step structures 408 at another side edge of patterned lower dielectric/sacrificial layer pairs 420 in FIG. 4G become another staircase structure 440 of memory stack 436 (e.g., second staircase structure 124B in FIG. 1). It is understood that details of forming other components in memory stack 436 (e.g., NAND memory strings) and local interconnects (e.g., word line via contacts) can be readily appreciated and thus, are not described herein.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate;
a memory stack disposed above the substrate and comprising a plurality of conductor layers and dielectric layers stacked alternatingly, wherein the plurality of conductor layers and dielectric layers comprise a plurality of conductor/dielectric layer pairs; and
an array of memory strings each extending vertically through an inner region of the memory stack,
wherein an outer region of the memory stack comprises a first staircase structure disposed on the substrate and a second staircase structure disposed on the substrate;
first edges of the plurality of conductor/dielectric layer pairs in the first staircase structure along a vertical direction away from the substrate are staggered laterally toward the array of memory strings; and
second edges of the plurality of conductor/dielectric layer pairs in the second staircase structure along the vertical direction away from the substrate are staggered laterally away from the array of memory strings.

2. The 3D memory device of claim 1, wherein a length of each of the conductor/dielectric layer pairs is the same.

3. The 3D memory device of claim 1, further comprising:
a first interconnect layer disposed above the memory stack; and
a plurality of first via contacts each in contact with a conductor layer in one of the conductor/dielectric layer pairs in the first staircase structure, the first via contacts each electrically connected to the first interconnect layer.

4. The 3D memory device of claim 1, further comprising:
a second interconnect layer disposed below the memory stack; and
a plurality of second via contacts each in contact with a conductor layer in one of the conductor/dielectric layer pairs in the second staircase structure, the second via contacts each electrically connected to the second interconnect layer.

5. The 3D memory device of claim 4, wherein:
the second interconnect layer and the memory stack are disposed at opposite sides of the substrate; and
the 3D memory device further comprises a plurality of third via contacts each extending through the substrate and electrically connected to the second interconnect layer and one of the second via contacts.

6. The 3D memory device of claim 1, wherein:
the first edges of each adjacent conductor/dielectric layer pairs in the first staircase structure are staggered laterally toward the array of memory strings, and
the second edges of each adjacent conductor/dielectric layer pairs in the second staircase structure are staggered laterally away from the array of memory strings.

7. The 3D memory device of claim 6, wherein an offset of the first edges of each adjacent conductor/dielectric layer pairs in the first staircase structure is the same as an offset of the second edges of each adjacent conductor/dielectric layer pairs in the second staircase structure.

8. The 3D memory device of claim 1, wherein the memory stack has a substantially parallelogram shape in a side view.

9. A three-dimensional (3D) memory device, comprising:
a substrate;
a memory stack disposed above the substrate and comprising a plurality of conductor layers and dielectric layers stacked alternatingly, wherein the plurality of conductor layers and dielectric layers comprise a plurality of conductor/dielectric layer pairs, wherein the plurality of conductor/dielectric layer pairs are staggered laterally along a lateral direction in parallel with the substrate and edges of the plurality of laterally staggered conductor/dielectric layer pairs on two sides form a same slope structure with respect to the substrate, and wherein a length of each pair of the plurality of conductor/dielectric layer pairs in the lateral direction is the same as all the other pairs; and an array of memory strings each extending vertically through the memory stack.

10. The 3D memory device of claim 9, further comprising:

a first interconnect layer disposed above the memory stack; and a plurality of first via contacts in contact with the conductor layers in some of the conductor/dielectric layer pairs, respectively, the first via contacts electrically connected to the first interconnect layer.

11. The 3D memory device of claim 9, further comprising:

a second interconnect layer disposed below the memory stack; and a plurality of second via contacts in contact with the conductor layers in some of the conductor/dielectric layer pairs, respectively, the second via contacts electrically connected to the second interconnect layer.

12. The 3D memory device of claim 11, wherein:

the second interconnect layer and the memory stack are disposed at opposite sides of the substrate; and the 3D memory device further comprises a plurality of third via contacts extending through the substrate and electrically connected to the second interconnect layer and the second via contacts.

13. The 3D memory device of claim 9, wherein each adjacent conductor/dielectric layer pairs are staggered laterally.

14. The 3D memory device of claim 13, wherein an offset of each adjacent conductor/dielectric layer pairs is the same.

15. The 3D memory device of claim 9, wherein the memory stack has a substantially parallelogram shape in a side view.

16. A three-dimensional (3D) memory device, comprising:

a substrate;

a memory stack disposed above the substrate and comprising a plurality of conductor layers and dielectric layers stacked alternatingly, wherein the plurality of conductor layers and dielectric layers comprise a plurality of conductor/dielectric layer pairs;

an array of memory strings each extending vertically through an inner region of the memory stack, wherein an outer region of the memory stack comprises a staircase structure disposed on the substrate, and edges of the plurality of conductor/dielectric layer pairs in the staircase structure along a vertical direction away from the substrate are staggered laterally away from the array of memory strings;

an interconnect layer disposed below the memory stack; and a plurality of first via contacts each in contact with a conductor layer in one of the conductor/dielectric layer pairs in the staircase structure, the first via contacts each electrically connected to the interconnect layer.

17. The 3D memory device of claim 16, wherein:

the interconnect layer and the memory stack are disposed at opposite sides of the substrate; and the 3D memory device further comprises a plurality of second via contacts each extending through the substrate and electrically connected to the interconnect layer and one of the first via contacts.

18. The 3D memory device of claim 16, wherein the edges of each adjacent conductor/dielectric layer pairs in the staircase structure are staggered laterally away from the array of memory strings.

19. The 3D memory device of claim 18, wherein an offset of the edges of each adjacent conductor/dielectric layer pairs in the staircase structure is the same.

20. The 3D memory device of claim 16, wherein a length of each of the conductor/dielectric layer pairs is the same.

* * * * *